United States Patent [19]
Trost

[11] Patent Number: 4,507,597
[45] Date of Patent: Mar. 26, 1985

[54] ELECTRO-MAGNETIC ALIGNMENT ASSEMBLIES

[75] Inventor: David Trost, Fairfield, Conn.

[73] Assignee: The Perkin-Elmer Corporation, Norwalk, Conn.

[21] Appl. No.: 502,995

[22] Filed: Jun. 10, 1983

[51] Int. Cl.³ .............................................. G05B 1/06
[52] U.S. Cl. .................................... 318/653; 318/687; 318/38; 318/640; 318/135; 355/133; 269/58
[58] Field of Search .................. 355/72, 133; 354/354; 335/222, 223; 318/640, 653, 687, 38, 135, 162; 269/58, 73; 310/12, 13

[56] References Cited

U.S. PATENT DOCUMENTS

| | | | |
|---|---|---|---|
| Re. 27,289 | 2/1972 | Sawyer | 318/38 X |
| Re. 27,436 | 7/1972 | Sawyer | 318/38 X |
| 3,889,164 | 6/1975 | Nishizawa et al. | 318/640 |
| 4,087,729 | 5/1978 | Yamazaki et al. | 318/640 X |

*Primary Examiner*—L. T. Hix
*Assistant Examiner*—Della J. Rutledge
*Attorney, Agent, or Firm*—Thomas P. Murphy; Edwin T. Grimes; F. L. Masselle

[57] ABSTRACT

This invention is directed to electromagnetic alignment apparatus, which is particularly adapted, among other possible uses, for use in aligning the wafers in a microlithography system, said apparatus comprising in combination a first magnetic circuit having a plurality of elements including a first magnet; a second magnetic circuit having a plurality of elements including a second magnet; the second magnetic circuit being disposed in spaced relationship with respect to the first magnetic circuit; a movable structural component adapted for mounting an object thereon; one element of each magnetic circuit being fixedly attached to the movable structural component; first and second current carrying coil assemblies mounted in the first magnetic circuit; the second coil assembly being disposed at an angle with respect to the first coil assembly; third and fourth current carrying coil assemblies mounted in the second magnetic circuit; the fourth coil assembly being disposed at an angle with respect to the third coil assembly; and control apparatus for controlling the flow and direction of the current through the coil assemblies, respectively.

11 Claims, 2 Drawing Figures

ELECTRO-MAGNETIC ALIGNMENT ASSEMBLIES

FIELD OF INVENTION

This invention relates to alignment apparatus and, more particularly, to electro-magnetic alignment apparatus which is particularly adapted, among other possible uses, for use in aligning the wafer in a microlithography system.

This application is closely related to my copending application entitled: "ELECTRO-MAGNETIC ALIGNMENT APPARATUS" filed on even date herewith and bearing application Ser. No. 502,998 filed Jun. 10, 1983. The disclosure therein is incorporated in the present specification by reference.

BACKGROUND OF THE INVENTION

Conventionally, in order to move an object in the three degrees of freedom defined by planar motion, it was necessary to employ three individual linear and/or rotary motors, each driving a single axis stage with the stages cascaded in series with each other. This required a number of appliances with a plurality of bearings supporting large masses which move in different directions, each bearing having unwanted compliances. This resulted in resonances, friction, backlash and inaccuracy of movement. The lowest mode resonant frequency tended to be much lower than desirable, making high accuracy servo control difficult.

Accordingly, it is a primary object of the present invention to provide a new and improved alignment apparatus, which will become apparent as the description proceeds.

SUMMARY OF THE INVENTION

In order to accomplish the desirable results, the invention provides in one form thereof, a new and improved electro-magnetic alignment apparatus which includes a first magnetic circuit having a plurality of elements and including a first magnet element, a second magnetic circuit having a plurality of elements and including a second magnet element, said second magnetic circuit being disposed in spaced relationship with respect to the first magnetic circuit. A movable structural component is included and means are provided for mounting an object on the movable structural component which may, for example, be a wafer of the type utilized in a microlithography system. One element of each magnetic circuit is fixedly attached to the movable structural component. A first current carrying coil assembly is mounted in the first magnetic circuit and a second circuit carrying coil assembly is also mounted in the first magnetic circuit disposed at an angle with respect to the first coil assembly. A third current carrying coil assembly is mounted in the second magnetic circuit, and a fourth current carrying coil assembly is also mounted in the second magnetic circuit disposed at an angle with respect to the third coil assembly. Control means are arranged to control the flow and direction of current through the coil assemblies, respectively. In one embodiment of the invention, the one element of each magnetic circuit attached to the movable structural component is the magnet element of its respective circuit.

According to one aspect of the invention the first and second current carrying coil assemblies are wound substantially orthogonally with respect to each other, and the third and fourth coil assemblies are wound substantially orthogonally with respect to each other. The first and third coil assemblies are wound substantially in parallel with respect to each other, and the second and fourth coil assemblies are wound substantially in parallel with respect to each other.

According to another aspect of the invention, a plurality of sensor means are provided for sensing the position of the movable structural component, and said sensor means acts as one input to the controller means.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this disclosure is based may readily be utilized as the basis of the design of other apparatus for carrying out the several purposes of the invention. It is important, therefore, that this disclosure be regarded as including such equivalent apparatus as does not depart from the spirit and scope of the invention.

Several embodiments of the invention have been chosen for purposes of illustration and description, and are shown in the accompanying drawings, forming a part of the specification.

DETAILED DESCRIPTION OF THE INVENTION

Figure 1:
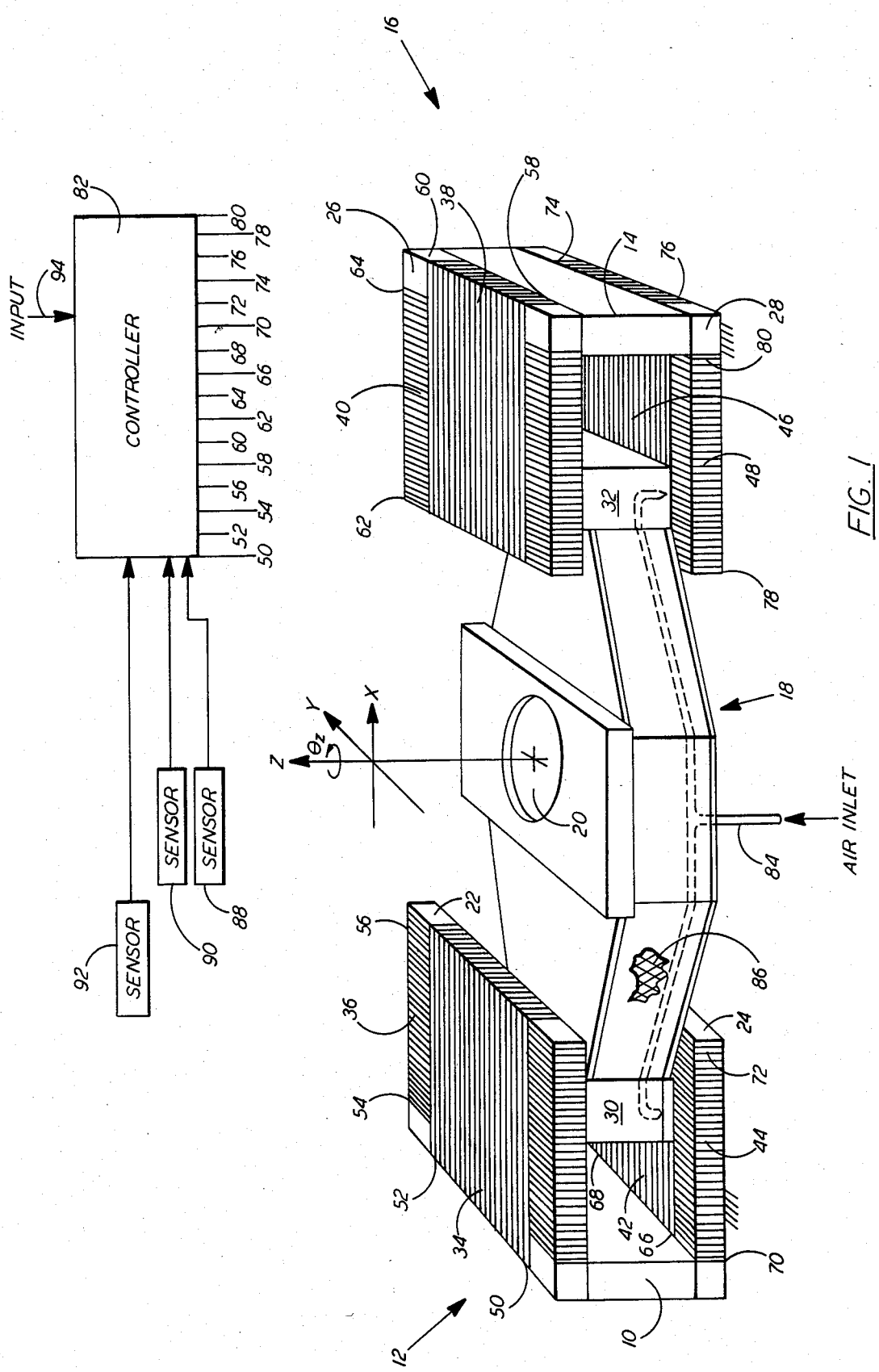
FIG. 1 is a perspective view showing one embodiment of the electro-magnet alignment assembly constructed according to the concepts of the present invention.

In the embodiment of the invention illustrated in FIG. 1, the electro-magnetic alignment apparatus comprises a first plurality of elements, including a first magnetic element 10, forming a first magnetic circuit indicated at 12, a second plurality of elements, including a second magnet element 14, forming a second magnetic circuit indicated at 16, and a movable structural component indicated at 18. The movable structural component 18 includes means for mounting an object, such as a wafer 20 for example, thereon.

The first plurality of elements for forming the first magnetic circuit 12 includes an iron upper plate 22, an iron bottom plate 24 and a side plate, which in the embodiment of FIG. 1 is the first magnet element 10. This magnet element 10 is a powerful permanent magnet and also serves to connect the upper and bottom plates.

The second plurality of elements for forming the second magnetic circuit 16 includes an iron upper plate 26, an iron bottom plate 28 and a side plate, which in the embodiment of FIG. 1 is the second magnet element 14. This magnet element 14, like the magnet element 10 is a powerful permanent magnet and serves to connect the upper and bottom plates.

One element of the first magnetic circuit 12 is fixedly attached to the movable structural component 18. In the embodiment of FIG. 1, this one element is an iron slug 30, which is movable between the upper plate 22 and the bottom plate 24. Likewise, one element of the second magnetic circuit 16 is fixedly attached to the movable structural component 18 which, in the embodiment of FIG. 1, is iron slug 32, that is movable between the upper plate 26 and the bottom plate 28.

The first magnetic circuit 12 has a first current carrying coil assembly 34, and a second current carrying coil assembly 36 mounted at an angle with respect to the first coil assembly. In the embodiment of FIG. 1, these two current carrying coil assemblies are disposed orthogonally with respect to each other.

In a similar manner the second magnetic circuit 16 has a third current carrying coil assembly 38, which is parallel to the coil assembly 34, and a fourth current carrying coil assembly 40 mounted at an angle with respect to the third coil assembly. In this embodiment coil assembly 38 is orthogonally disposed with respect to the coil assembly 40.

In some embodiments two current carrying coil assemblies for each magnetic circuit are sufficient to establish the necessary motivating forces, while in other embodiments additional current carrying coil assemblies are necessary. FIG. 1 shows, in the first magnetic circuit 12, a fifth current carrying coil assembly 42, which is parallel to coil assembly 34 and a sixth current carrying coil assembly 44 which is parallel to coil assembly 36 and perpendicular to coil assembly 42. In the second magnetic circuit 16, a seventh current carrying coil assembly 46 is mounted parallel to the coil assembly 38, and an eighth current carrying coil assembly 48 is mounted parallel to coil assembly 40 and perpendicular to coil assembly 46.

The first coil assembly 34 is provided with a first lead 50 and a second lead 52, while the second through the eighth coil assemblies are provided with leads 54, 56, 58, 60, 62, 64, 66, 68, 70, 72, 74, 76, 78 and 80, respectively. The electrical current supplied to each of the leads is controlled by a controller 82, as will be discussed more fully hereinafter.

The movable structural component 18 is mounted for movement with respect to the first and second magnetic circuits 12 and 14 by any suitable bearing means such as, for example, an air bearing mounted between the iron plate 30 and the bottom plate 34 and an air bearing mounted between the iron plate 32 and the bottom plate 28. Air is supplied to the air bearings by means of a piping system 84, provided for the purpose.

In some embodiments it may be desirable to fabricate the movable structural component 18 with an aluminum honeycomb structure to provide structural strength at minimum weight, as indicated at 86.

Still referring to FIG. 1, any suitable sensor means may be used to sense the position of the object or wafer 20 mounted on the movable structural component 18. Thus, a sensor 88 senses the position in the X direction, sensor 90 in the Y direction, and sensor 92 in the $\theta$ direction. These sensors provide inputs to the controller 82.

In operation, the first magnetic circuit 12 has a magnetic flux that follows the path from the magnet 10 through the bottom plate 24, slug 30, upper plate 22 and back to the magnet 10. Coils 34 and 36 pass through the gap between the slug 30 and the upper plate 22, while coils 42 and 44, if employed, pass through the gap between the slug 30 and the bottom plate 24.

In a similar manner the second magnetic circuit 16 has a magnetic flux that follows the path from the magnet 14 through the upper plate 26, slug 32, and bottom plate 28 back to the magnet 14. Coils 38 and 40 pass through the gap between slug 32 and upper plate 26, while coils 46 and 48, if employed, pass through the gap between the slug 32 and the bottom plate 24.

The aforesaid magnetic flux bridges the gaps, and by modifying the flux in these areas with electric currents passing through the coils, a variety of forces may be produced on the movable structural component 18. When the coils wound parallel to the X axis 34, 38 and 42, 46 if employed are excited, the movable structural component 18 is forced along the Y axis. If the current in these coils is reversed, then the movable structural component and hence the wafer 20 will move along the Y axis in the opposite direction. Since there are two elements being forced, slug 30 and slug 32, which are separated by a moment arm, differential forcing of these elements in the Y direction causes a torque about the Z axis. That is, if coil 34 and 42, if employed, are excited in one direction and coil 38 and 46, if employed, are excited in the opposite direction, then the wafer 20 will rotate. Excitation of the coils parallel to the Y axis, coils 26, 40, 44 and 48, if employed, causes force along the X axis. If the current in these coils is reversed, then the wafer 20 will move along the X axis in the opposite direction.

The above indicated force or movement is explained by Newton's third law, i.e., "Every force has an equal and opposite force" (or reaction). Current flowing through the wire exerts a lateral force on the wire when the wire is in a magnetic field. A "reaction force" is produced in the pole pieces which carry the magnetic field. In the present instance, since the fixed elements 10, 22 and 24 in the first magnetic circuit and 14, 26 and 88 in the second magnetic circuit cannot move, the slug 30 and 32 are forced to move. They, of course, carry the movable structural component 18 with the wafer 20.

The controller 82 may be of any suitable type. For example, it may have an input 94 through which either manually or by microprocessor a command is given directing the movable structural component 18 and hence the wafer 20 to move to a specific position. The sensors 88, 90 and 92 sense the actual wafer position and if this differs from the commanded position, current is supplied to the coils through one or more of the appropriate leads, 50, 52, 54, 56, 58, 60, 62, 64, 66, 68, 70, 72, 74, 76, 78 and 80. When the actual position reaches the commanded position, the supply of current is terminated and the wafer remains in a stationary position.

Figure 2:
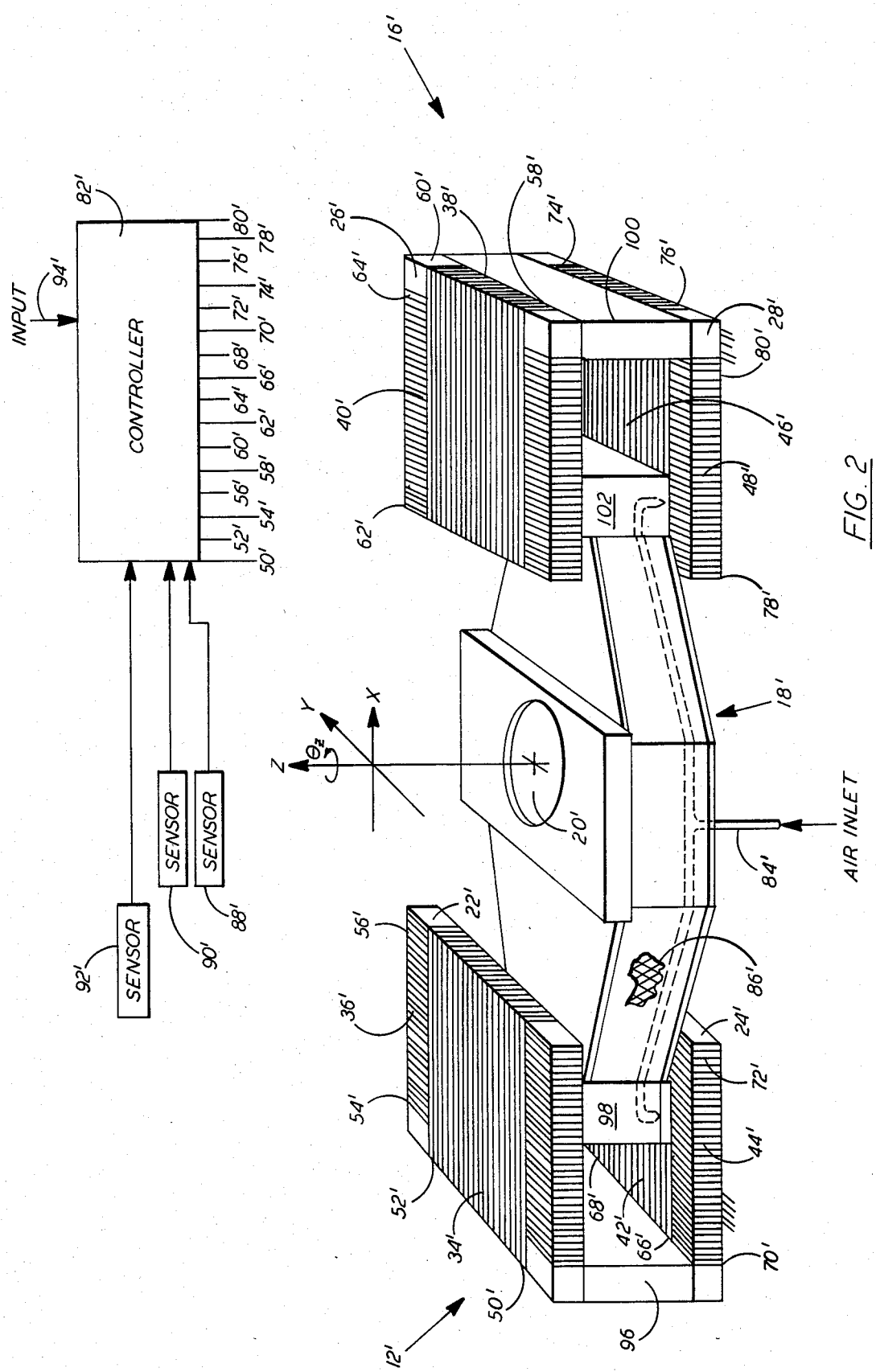
FIG. 2 is a perspective view similar to FIG. 1 but showing another embodiment of the invention.

Referring next to the embodiment of FIG. 2, identical elements are referred to with the same reference numerals plus a prime mark.

The structural differences between the embodiments of FIGS. 1 and 2 resides in the location of the magnets in the magnetic circuits. Thus, in the first magnetic circuit the magnet 10 of FIG. 1 has been replaced by an iron side plate 96 in FIG. 2. This fixed element serves to connect the upper plate 22' with the bottom plate 24' and it forms part of the magnetic flux path in the first magnetic circuit. In the embodiment of FIG. 2 the magnet 98, per se, is the one element of the first magnetic circuit 12' fixedly attached to the movable structural component 18'. As a result the magnet 98 is movable between the upper plate 22' and the bottom plate 24'.

In the second magnetic circuit the iron side plate 100 in the embodiment of FIG. 2 replaces the magent 14 of FIG. 1, and the magnet 102 of FIG. 2 replaces the iron plate 32 of FIG. 1.

In all other respects the apparatus of FIG. 2 is constructed identical to that of FIG. 1. Both embodiments are controlled and operated in the same manner.

It will thus be seen that the present invention does indeed provide an improved electromagnetic alignment apparatus, which has higher precision with lower vibration and great simplicity, as compared to prior art such apparatus. There is substantially no backlash and very low friction because controlled motion in three degrees of freedom is achieved with a single moving part. The lowest resonant frequency of the apparatus can be made very high. A very high band width servo can be used, which gives good control and high accuracy.

Although certain particular embodiments of the invention are herein disclosed for purposes of explanation, further modifications thereof, after study of this specification, will be apparent to those skilled in the art to which the invention pertains. Reference should accordingly be had to the appended claims in determining the scope of the invention.

What is claimed is:

1. A commutatorless electro-magnetic alignment apparatus comprising, in combination:
    a first magnetic circuit having a plurality of elements including a first magnet element;
    a second magnetic circuit having a plurality of elements including a second magnet element disposed in spaced relationship with respect to said first magnetic circuit;
    a movable structural component, means for mounting an object on said component;
    one element of each magnetic circuit being fixedly attached to said movable structural component;
    said movable structural component being a single structure which is rigid in its plane of motion;
    a first current carrying coil assembly mounted in said first magnetic circuit;
    a second current carrying coil assembly mounted in said second magnetic circuit, said first and said second coil assemblies being mounted at an angle with respect to each other;
    a third current carrying coil assembly mounted in said second magnetic circuit;
    a fourth current carrying coil assembly mounted in said second magnetic circuit, said third and fourth coil assemblies being mounted at an angle with respect to each other; and
    controller means for controlling the flow and direction of current through said coil assemblies, respectively.

2. Electro-magnetic alignment apparatus according to claim 1 wherein said one element of each magnetic circuit is the magnet element of its respective circuit.

3. Electro-magnetic alignment apparatus according to claim 1 wherein said first and second current carrying coil assemblies are wound substantially orthogonally with respect to each other, and said third and fourth coil assemblies are wound substantially orthogonally with respect to each other.

4. Electro-magnetic alignment apparatus according to claim 1 wherein said first and third coil assemblies are wound substantially in parallel with respect to each other, and said second and fourth coil assemblies are wound substantially in parallel with respect to each other.

5. Electro-magnetic alignment apparatus according to claim 1 further comprising a fifth current carrying coil assembly mounted in said first magnetic circuit in spaced relationship with respect to said first coil assembly and substantially in parallel thereto;
    a sixth current carrying coil assembly mounted in said first magnetic circuit in spaced relationship with respect to said second coil assembly and substantially in parallel thereto;
    a seventh current carrying coil assembly mounted in said second magnetic circuit in spaced relationship with respect to said third coil assembly and substantially in parallel thereto; and
    an eighth current carrying coil assembly mounted in said second magnetic circuit in spaced relationship with respect to said fourth coil assembly and substantially in parallel thereto.

6. Electro-magnetic alignment apparatus according to claim 1 wherein said apparatus further comprises a plurality of sensor means for sensing the position of said movable structural component, said sensor means providing an input to said controller means.

7. Electro-magnetic alignment apparatus according to claim 1 wherein each of said plurality of elements forming said magnetic circuits include an upper plate, a bottom plate spaced from said upper plate, and a side plate interconnecting the upper and bottom plates, said one element of each magnetic circuit being mounted between said upper and bottom plates.

8. Electro-magnetic alignment apparatus according to claim 7 wherein said one element of each magnetic circuit is the magnet element of its respective circuit.

9. Electro-magnetic alignment apparatus according to claim 7 wherein said first and second coil assemblies are wound around said upper plate in said first magnetic circuit, and said third and fourth coil assemblies are wound around the upper plate in said second magnetic circuit.

10. Electro-magnetic alignment apparatus according to claim 9 wherein said fifth and sixth coil assemblies are wound around the bottom plate in said first magnetic circuit and, seventh and eighth coil assemblies are wound around the bottom plate in said second magnetic circuit.

11. Electro-magnetic alignment apparatus according to claim 1 wherein the movable structural component and said one element of each magnetic circuit are supported by the fixed elements in the magnetic circuits by fluid film bearings.

* * * * *